United States Patent
McCollum et al.

(10) Patent No.: US 6,753,711 B2
(45) Date of Patent: Jun. 22, 2004

(54) DIGITAL SUMMING PHASE-LOCK LOOP CIRCUIT WITH SIDEBAND CONTROL AND METHOD THEREFOR

(75) Inventors: Robert L. McCollum, Chandler, AZ (US); James W. Taylor, Tampe, AZ (US)

(73) Assignee: Comtech EF Data, Tempe, AZ (US)

( * ) Notice: Subject to any disclaimer, the term of this patent is extended or adjusted under 35 U.S.C. 154(b) by 0 days.

(21) Appl. No.: 10/183,281

(22) Filed: Jun. 26, 2002

(65) Prior Publication Data

US 2004/0000936 A1 Jan. 1, 2004

(51) Int. Cl.[7] .................................................. H03L 7/06
(52) U.S. Cl. .......................................... 327/156; 331/46
(58) Field of Search ................................. 327/156, 147, 327/150, 146, 145, 154, 12, 105, 107, 106; 331/46, 50, 55, 56; 375/215, 375, 376

(56) References Cited

U.S. PATENT DOCUMENTS

| | | | | |
|---|---|---|---|---|
| 5,210,509 A | * | 5/1993 | Greeff et al. | 331/4 |
| 5,838,749 A | * | 11/1998 | Casper et al. | 375/376 |
| 5,963,608 A | * | 10/1999 | Casper et al. | 375/373 |

* cited by examiner

Primary Examiner—Linh M. Nguyen
(74) Attorney, Agent, or Firm—A. Mitchell Harris; Jeffrey D. Moy; Weiss, Moy & Harris, P.C.

(57) ABSTRACT

A digital summing phase-lock loop circuit with sideband control provides high accuracy and high speed acquisition in a multi-loop frequency synthesizer. A digital phase comparator is used to control a voltage-controlled oscillator in response to inputs from multiple external loops. An initial sweep condition is set by a sweep control circuit to provide resolution of lock ambiguities in the multiple external loops. Sideband selection may be performed by selecting on of an inverted or non-inverted output of the digital phase comparator.

16 Claims, 3 Drawing Sheets

DIGITAL SUMMING PHASE-LOCK LOOP CIRCUIT WITH SIDEBAND CONTROL AND METHOD THEREFOR

CROSS-REFERENCE TO RELATED PATENT

The present application is related to U.S. Pat. No. 6,028,460 issued to the same inventors on Feb. 22, 2000. The specification of the above-referenced patent application is incorporated herein by reference.

BACKGROUND OF THE INVENTION

1. Field of the Invention

The present invention relates generally to frequency synthesizers, and more specifically, to a method and apparatus for reducing phase noise in synthesizers.

2. Background of the Invention

Frequency synthesizers are primarily used in radio-frequency (RF) communications equipment, but have also found general-purpose application in digital computing systems as clock synthesizers and various other applications where precise signal generation and reception are critical.

A phase-lock loop circuit typically is present at the core of a frequency synthesizer. A phase detector compares the output of the frequency synthesizer with a reference signal that may be divided down from a high-frequency clock. The output of the frequency synthesizer may also be divided down to provide a low frequency signal for phase comparison, depending on the frequency of the signal being generated by the frequency synthesizer.

Direct up-conversion or down-conversion of a high-frequency signal, while providing a simple single loop system, is typically not used in high accuracy synthesizer applications. The phase noise present at the output of the synthesizer within the bandwidth of the loop filter is a function of the phase noise of the comparison reference frequency and various noise sources present within the loop filter, phase comparator and other components of the loop. The phase noise for a single loop system directly reflects the phase noise of the reference source.

A multi-loop or "summing loop" synthesizer reduces the phase noise of the synthesizer output by providing multiple reference comparisons that result in feedback adjustment of the synthesizer output frequency (and phase). A low frequency reference having much lower phase noise is used to fine-tune the synthesizer output. However, the phase comparison itself provides a theoretical and practical limit on synthesizer output phase noise because the phase noise of the phase comparator adds a contribution to the total phase noise at the synthesizer output. Further, control of the sideband selection is complicated in a multi-loop synthesizer, as the loop can lock up at either the sum or difference frequencies of the combined signal.

Phase comparators are implemented in either digital circuitry or analog circuitry. Phase noise in an analog phase comparator is a direct function of in-loop-bandwidth noise voltages that directly affect synthesizer oscillator output. Phase noise in a digital phase comparator is caused by any number of factors such as sampling hysteresis, non-linear or chaotic input circuit behavior and digital circuit jitter internal to the phase comparator. The phase noise of a digital phase comparator is typically at least an order of magnitude greater than that of a high-quality analog phase comparator.

Digital phase comparators are desirable for use in frequency synthesizers, as they typically provide a phase-lock loop with a more accurate and higher-speed frequency acquisition than a phase-lock loop using an analog phase comparator. Digital phase comparators may also provide a more accurate quadrature (sideband) relationship than an analog phase comparator. The above-incorporated patent application discloses a hybrid phase-lock loop that switches between digital phase comparison and analog phase comparison to provide improved signal acquisition and reduced phase noise. However, the phase-lock loop disclosed therein is a single-loop system and the techniques disclosed do not apply directly to a multi-loop synthesizer, and does not provide a mechanism for preventing erroneous lock-up in a multi-loop configuration.

Therefore, it would be desirable to provide a multi-loop frequency synthesizer including a digital phase comparator and method having reduced phase noise, while maintaining high acquisition speed and accuracy.

SUMMARY OF THE INVENTION

The above objective of providing reduced phase noise and high acquisition speed and accuracy in a frequency synthesizer is achieved in a phase-lock loop circuit and method. The phase-lock loop circuit includes a digital phase comparator having a first input and a second input coupled to one of multiple external loops, a loop filter and a sweep control circuit for resolving lock ambiguities in multiple external loops by setting an initial sweep direction of the loop filter.

The apparatus may be embodied in a frequency synthesizer including a fine loop, a coarse loop and an output voltage-controlled oscillator, where the phase-lock loop circuit output is coupled to an input of the output voltage-controlled oscillator for providing the output of the frequency synthesizer.

The foregoing and other objectives, features, and advantages of the invention will be apparent from the following, more particular, description of the preferred embodiment of the invention, as illustrated in the accompanying drawings.

DETAILED DESCRIPTION OF THE EMBODIMENTS

Figure 1:
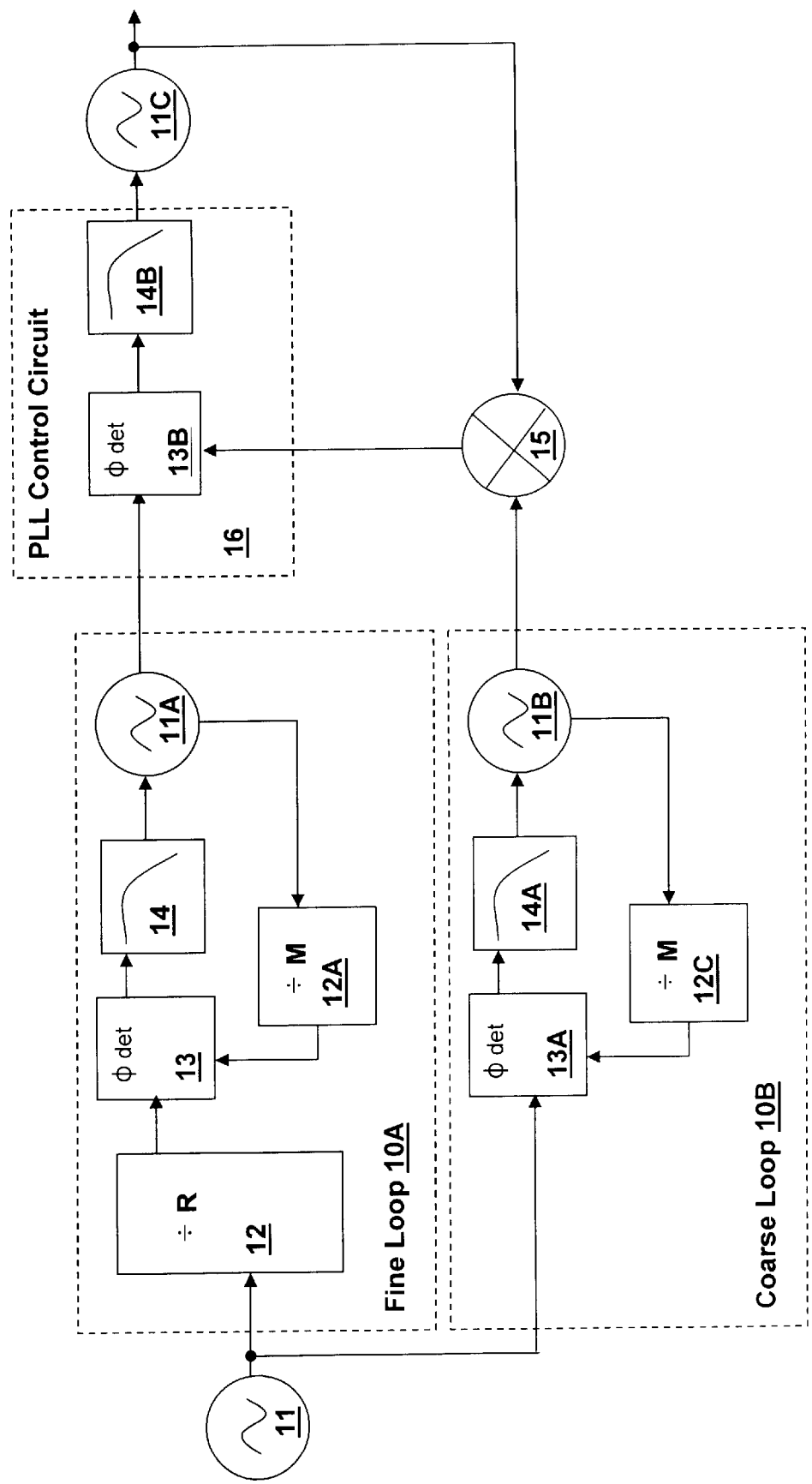
FIG. 1 is a block diagram depicting a frequency synthesizer in which an embodiment of the present invention may be embodied.

Referring now to the figures and in particular to FIG. 1, a frequency synthesizer in which an embodiment of the present invention may be embodied is depicted in a block diagram. The depicted frequency synthesizer is a multi-loop synthesizer including a coarse loop 10B for generating coarse steps in the synthesizer output. For example, coarse loop 10B may generate an L-band frequency of 1.60 GHz to 1.64 GHz in 20 MHz steps, providing a selection of only three output frequencies. However, a coarse loop can be designed with any number of steps and the number of steps may exceed the number of steps in the fine loop portion of a synthesizer. Fine-tuning in the exemplary synthesizer is provided by fine loop 10A, which may for example produce a frequency of 20 Mhz to 40 Mhz in 41.666 KHz steps. Generally, the frequency range of the fine loop is equal to the step size of the coarse loop in a synthesizer, but this is not a requirement.

Fine loop 10A includes a voltage-controlled oscillator (VCO) 11A for generating an output frequency from 20–40 Mhz in steps of 41.66 KHz. VCO 11A is phase-locked to a subdivided signal provided by divider 12 from reference oscillator 11. The combination of effective multiplication provided by divider 12A and division provided by divider 12 generates the step frequencies according to M/R times the reference frequency. Phase comparator 13 and low-pass filter 14 provide a VCO 11A output signal that is phase-locked to the reference signal provided by reference oscillator 11.

Coarse loop 10B includes a voltage-controlled oscillator (VCO) 11B for generating an output frequency from 1.60–1.64 Ghz in three 20 MHz steps. Divider 12C provides a multiplication factor for the coarse loop. VCO 11B is phase-locked directly to the output of reference oscillator 11 (and thus also in phase-lock with the output of fine loop 10A VCO 11A). Phase comparator 13A and low-pass filter 14A provide a VCO 11B output signal that is phase-locked to the reference signal provided by reference oscillator 11.

The output of coarse loop 10B is combined by a mixer 15 with the output of synthesizer provided by a VCO 11C. The output of mixer 15 contains sum and difference products from the output frequencies of VCO 11C and coarse loop 10B. PLL control circuit 16 provides the control voltage for VCO 11C, which is generated by comparing the phase of the output of fine loop 10A with the output of mixer 15. PLL control circuit 16 include a phase comparator 13B and a loop filter 14B for providing a control voltage signal of finite bandwidth to phase-lock VCO 11C with the fine loop 10A and coarse loop 10B.

The structure of the above-described circuit results in a dramatic reduction of phase noise at the output of the synthesizer, as PLL control circuit 16 is comparing a relatively low frequency to the output mixer 15, reducing the loop gain requirement (control voltage delta vs. phase range) of the PLL formed by VCO 11C mixer 15 and PLL control circuit 16. Typically PLL control circuit 16 comprises an analog phase comparator and associated circuits for providing a low phase noise value and for controlling the sideband selection and lock frequency of the loop.

Sideband selection and lock frequency control in a multi-loop synthesizer presents a problem in that ambiguities exist due to multiple stable states or quasi-stable states for a particular set of divider counts. For example, if reference VCO 11 frequency is 10 MHz, divider 12 is set to 100 and divider 12A is set to 150, VCO 11C generates a 15 Mhz signal. The 15 Mhz signal is mixed with, for example, a 1.60 GHz signal generated by coarse loop 10B (divider 12C is set to 1600). The resulting output of mixer 15 has a component at 1.585 Ghz and one at 1.615 GHz, and therefore the output of VCO 11C will lock in at either of the aforementioned frequencies, generating ambiguities that will lead to improper lock-in.

Figure 2:
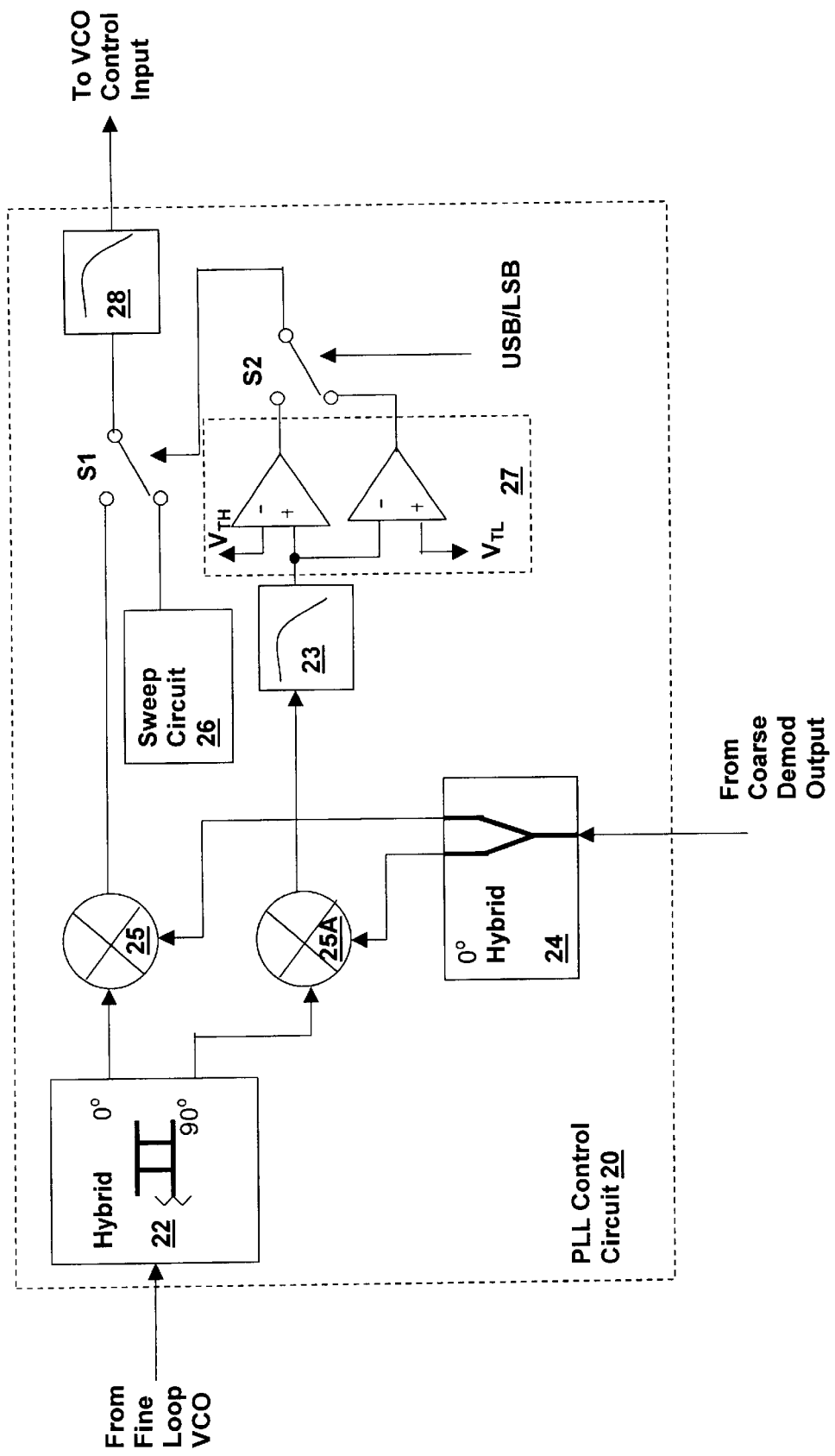
FIG. 2 is a block diagram depicting a prior art analog phase comparator and control circuit.

Referring now to FIG. 2, a prior art PLL control circuit 20 is depicted. The output of a fine loop VCO (e.g., output of VCO 11A of FIG. 1) is coupled to a 90° hybrid 22 to produce a quadrature pair of output signals. The quadrature pair are introduced to mixers 25 and 25A that mix them with the output of a demodulated coarse loop output (e.g., output of mixer 15 of FIG. 1). The outputs of mixer 25 is selectively introduced to low-pass filter 28 by switch S1, whereby the output of low-pass filter 28 provides a VCO control signal for the synthesizer (e.g., control voltage input of VCO 11C of FIG. 1). Switch S1 is also coupled to sweep circuit 26 and selectively provides a sweep signal to drive the VCO control voltage to the proper lock point, as the output of mixer 25 will not provide the proper output voltage if the synthesizer VCO frequency is on the opposite side of the coarse loop output frequency from the desired frequency selected via the fine loop/coarse loop combination.

Mixer 25A output is used to provide a solution to the sideband selection and ambiguity problems. At both lock frequencies: upper sideband (USB) and lower sideband (LSB), the output of low pass filter 23 will provide a DC output (due to the DC demodulated component of mixer 25A when the coarse demod input and the fine loop input are at the same frequency). In the above-described state, the synthesizer output frequency is either the sum or the difference coarse loop output frequency and the fine loop output frequency. The sign of the DC voltage provided at the output of low-pass filter will be positive or negative depending on whether the sum or the difference is present. Window comparator 27 determines that the DC output of low-pass filter 23 has exceeded a threshold in either the positive or negative direction and depending on the selection state of a sideband select switch S2, applies the output of the threshold detection to switch S1 to engage sweep circuit 26 if the sign of the DC output of low-pass filter 23 indicates that the loop has locked at an incorrect (image) frequency.

While the above described circuit solves the ambiguity problem, it requires careful control of the phase relationship through the analog components: hybrids 22, 24 and mixers 25 and 25A. The use of expensive precision and temperature-stable components (that may be very difficult or impossible to implement in an integrated circuit solution, depending on the fabrication technology) makes the analog solution subject to low yields or tuning requirements. Further, the lag time associated with low-pass filter 23 and stability margin provided by the thresholds of window comparator 27 can slow the activation of sweep circuit 26, providing a less than ideal response to an improper lock condition.

Figure 3:
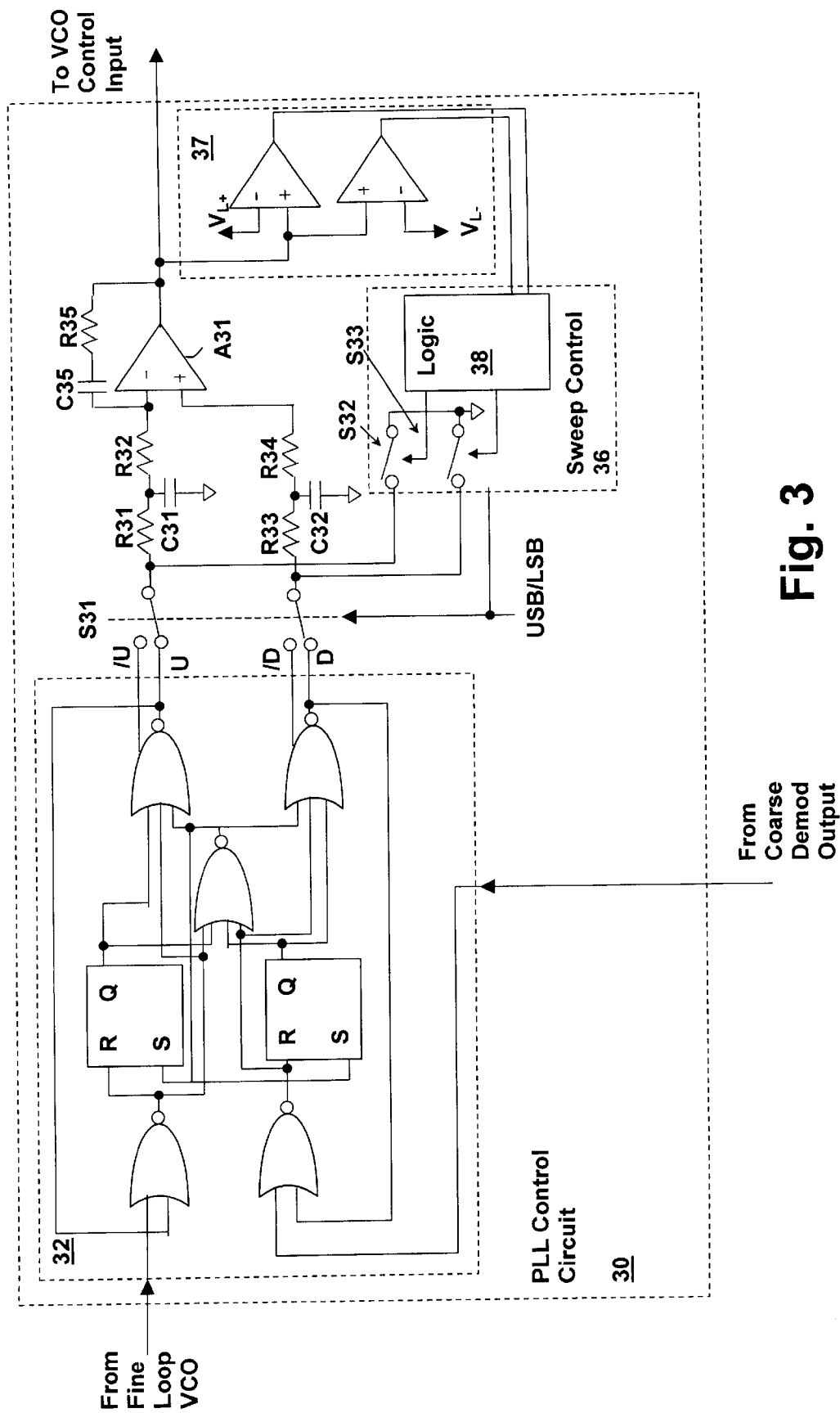
FIG. 3 is a block diagram depicting a digital phase comparator and control circuit in accordance with an embodiment of the present invention.

An alternative to the prior art analog solution depicted in FIG. 2 is provided by embodiments of the present invention, which incorporate a digital phase/frequency comparator that eliminates the need for tuning and/or expensive analog components. Referring now to FIG. 3, a PLL control circuit 30 in accordance with an embodiment of the invention is depicted. A digital phase comparator 32 has an input coupled to a demodulated coarse loop output (e.g., output of mixer 15 of FIG. 1). The output of a fine loop VCO (e.g., output of VCO 11A of FIG. 1) is coupled to a second input of digital phase/frequency comparator 32.

Digital phase/frequency comparators are well known in the art and are available in pre-packaged integrated forms such as the MCH12140 Phase-Frequency Detector integrated circuit manufactured by ON Semiconductor, a functional illustration of which is included in the block depicting phase comparator 32. The outputs of phase/frequency comparator 32 provide complementary pulse sets. Pulse set D and/D are always active when the frequency of the coarse demod output is lower than the fine loop VCO frequency or the phase is lagging, and pulse set C and /C are always active when the frequency of the coarse demod output is higher than the fine loop VCO frequency or the phase is leading. The pulse set that is not always active produces pulses proportional to the amount of phase difference between the inputs. When the phase/frequency comparator 32 input frequencies match, both pulse set outputs pulse and when the phases match, a 50% duty cycle is produced at all pulse outputs, which when filtered, yields a zero error voltage.

The pulse outputs of phase comparator 32 are selected by a sideband select switch S31 that selects either the inverted or non-inverted pair of up and down pulses and applies them differentially to an analog filter/integrator stage. The sideband selector is not required for single-sideband operation as is required to remove the ambiguities in the prior art circuit of FIG. 2 and for single-sideband operation switch S32 may be removed and one pair of the up/down pulses may be hardwired to the analog filter/integrator stage.

Resistors R31–R35, capacitors C31–33 and amplifier A31 provide a low-pass/integrator function that filters high frequency components and changes the phase of the loop response by 90 degrees lag. The phase change is necessary for stability since phase comparator 32 is a phase frequency comparator, rather than a pure "mixer" phase comparator. In order to prevent lock ambiguity, the initial condition of the state of integrator is set by applying a saturating level to one of the differential low-pass/integrator inputs. Switch S32 or switch S33 is momentarily pulsed to set the initial direction that the VCO control voltage will sweep (generally at the time of initial start-up or at frequency changes), by digital logic 38 that may be coupled to the control logic of the synthesizer that sets frequency dividers, etc. Only one of switches S32 or S33 is required for single-sideband operation, as the initial direction of sweep is set depending on the sideband selected. An anti-lockup circuit comprising a pair of threshold comparators 37 is also coupled to logic 38 and may either signal other control logic to activate one of switches S32 or S33, or may directly control activate the proper switch when the output of the integrator exceeds a predetermined threshold, indicating that amplifier A31 has been driven to a rail due to an improper lock condition.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A phase-lock control circuit, comprising:
    a digital phase comparator having a first input and a second input for coupling to multiple external frequency sources;
    a loop filter coupled to an output of the phase comparator for generating a frequency control output;
    a sideband selector for selecting a sideband combining said multiple external frequency sources, wherein the sideband selector selects one of at least one inverted output of said digital phase comparator and at least one non-inverted output of said digital phase comparator; and
    and a sweep control circuit for resolving lock ambiguities in the multiple external frequency sources by setting an initial sweep direction of the loop filter.

2. The phase-lock control circuit of claim 1, wherein a control signal of said sideband selector is coupled to said sweep control circuit, whereby said initial sweep direction is set in conformity with said selected sideband.

3. The phase-lock control circuit of claim 1, wherein said loop filter includes:
    an integrator for generating said frequency control output; and
    a low pass filter having an output coupled to an input of said integrator and an input coupled to an output of said phase comparator, and wherein said low pass filter accepts a pre-set output of said sweep control circuit, whereby said initial sweep direction is set.

4. The phase-lock control circuit of claim 1, further comprising a limit detector for detecting whether or not said frequency control output has exceeded a false lock point voltage, and wherein said limit detector is coupled to said sweep control circuit for resetting said sweep control circuit in response to detecting that said false lock point voltage has been exceeded.

5. The phase-lock control circuit of claim 4, wherein said limit detector detects that said false lock point voltage has been exceeded by comparing said frequency control output to a predetermined saturation voltage threshold for said loop filter.

6. The phase-lock control circuit of claim 1, wherein said digital phase comparator generates a differential digital output, and wherein said loop filter includes an analog differential input coupled to said differential digital output.

7. A frequency synthesizer, comprising:
    a voltage-controlled oscillator for generating an output of said synthesizer;
    a first loop for generating a coarse frequency output;
    a second loop for generating a fine frequency output, wherein said fine frequency output is a difference between a frequency of said output of said synthesizer and a frequency of said coarse frequency output;
    a mixer coupled to said output of said synthesizer and an output said first loop for producing a fine frequency comparison signal; and
    a phase-lock control circuit including a digital phase comparator and a loop filter for producing a control voltage coupled to an input of said voltage-controlled oscillator,
    wherein said phase lock control circuit further comprises a sideband selector for selecting a sideband combining said coarse frequency output and said fine frequency output, and wherein the sideband selector selects one of at least one inverted output of said digital phase comparator and at least one non-inverted output of said digital phase comparator.

8. The frequency synthesizer of claim 7, wherein said phase lock control circuit includes a sweep control circuit for resolving lock ambiguities between said coarse loop and said fine loop by setting an initial sweep direction of said loop filter.

9. The frequency synthesizer of claim 7, wherein a control signal of said sideband selector is coupled to said sweep control circuit, whereby said initial sweep direction is set in conformity with said selected sideband.

10. The frequency synthesizer of claim 7, wherein said loop filter includes:
    an integrator for generating said frequency control output; and
    a low pass filter having an output coupled to an input of said integrator and an input coupled to an output of said phase comparator, and wherein said low pass filter accepts a pre-set output of said sweep control circuit, whereby said initial sweep direction is set.

11. The frequency synthesizer of claim 7, further comprising a limit detector for detecting whether or not a frequency of said voltage-controlled oscillator has exceeded a false lock point, and wherein said limit detector is coupled to said sweep control circuit for resetting said sweep control circuit in response to detecting that false lock point has been exceeded.

12. The frequency synthesizer of claim 11, wherein said limit detector detects that said false lock point voltage has been exceeded by comparing an output of said loop filter to a predetermined voltage threshold.

13. The frequency synthesizer of claim 7, wherein said digital phase comparator generates a differential digital output, and wherein said loop filter includes an analog differential input coupled to said differential digital output.

14. A method for generating a frequency control voltage for a voltage-controlled oscillator, comprising:

digitally comparing outputs of multiple frequency sources to determine at least one phase-correction signal, by generating an inverted phase-correction signal and a non-inverted phase-correction signal;

filtering said phase-correction signal to generate said frequency control voltage;

selecting a sideband relationship between said multiple frequency sources by performing said filtering on one of said inverted phase-correction signal and said non-inverted phase-correction signal; and setting an initial sweep direction of said frequency control voltage for resolving lock ambiguities between said multiple frequency sources.

15. The method of claim 14, wherein said setting includes setting said initial sweep direction in conformity with said selected sideband.

16. The method of claim 14, further comprising:

detecting whether or not said frequency control voltage has exceeded a false lock point voltage; and in response to detecting that said frequency control voltage has exceeded a false lock point voltage, performing said setting whereby said frequency control voltage is restored.

* * * * *